US011164965B2

United States Patent
Iwakaji et al.

(10) Patent No.: US 11,164,965 B2
(45) Date of Patent: Nov. 2, 2021

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Yoko Iwakaji, Meguro (JP); Tomoko Matsudai, Shibuya (JP); Takeshi Suwa, Kawasaki (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 124 days.

(21) Appl. No.: 16/570,649

(22) Filed: Sep. 13, 2019

(65) Prior Publication Data
US 2020/0303526 A1  Sep. 24, 2020

(30) Foreign Application Priority Data
Mar. 20, 2019 (JP) .............................. JP2019-052614

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0638* (2013.01); *H01L 29/0834* (2013.01); *H01L 29/1095* (2013.01)

(58) Field of Classification Search
CPC ............. H01L 29/7397; H01L 29/0834; H01L 29/1095; H01L 29/0638; H01L 29/0696; H01L 29/36; H01L 29/0634; H01L 29/167
(Continued)

(56) References Cited

U.S. PATENT DOCUMENTS

| 4,980,743 A | 12/1990 | Nakagawa et al. |
| 2016/0276469 A1 | 9/2016 | Machida et al. |

(Continued)

FOREIGN PATENT DOCUMENTS

| JP | 64-57674 A | 3/1989 |
| JP | 8-21713 B2 | 3/1996 |

(Continued)

*Primary Examiner* — Caleen O Sullivan
(74) *Attorney, Agent, or Firm* — Oblon, McClelland, Maier & Neustadt, L.L.P.

(57) ABSTRACT

A semiconductor device of an embodiment includes first and second electrodes; first and second gate electrodes; and semiconductor layer including first and second planes, the semiconductor layer including a first semiconductor region of first conductivity type including first portion, second portion having a carrier concentration higher than the first portion, and third portion having a carrier concentration lower than the second portion; a second semiconductor region of second conductivity type between the first semiconductor region and the first plane and facing the first gate electrode; a third semiconductor region of first conductivity type between the second semiconductor region and the first plane and contacting the first electrode; a fourth semiconductor region of second conductivity type between the first semiconductor region and the second plane and facing the second gate electrode; and a fifth semiconductor region of first conductivity type between the fourth semiconductor region and the second plane.

10 Claims, 6 Drawing Sheets

(51) Int. Cl.
*H01L 29/10* (2006.01)
*H01L 29/08* (2006.01)

(58) Field of Classification Search
USPC .......................................................... 257/143
See application file for complete search history.

(56) References Cited

U.S. PATENT DOCUMENTS

| | | |
|---|---|---|
| 2016/0343838 A1 | 11/2016 | Hashimoto |
| 2018/0005829 A1 | 1/2018 | Takishita et al. |
| 2020/0105874 A1* | 4/2020 | Yilmaz ............... H01L 21/2855 |

FOREIGN PATENT DOCUMENTS

| | | |
|---|---|---|
| JP | 3111725 B2 | 11/2000 |
| JP | 6092760 B2 | 3/2017 |
| JP | 6102092 B2 | 3/2017 |
| JP | 6227677 B2 | 11/2017 |
| WO | WO 2017/047276 A1 | 3/2017 |

* cited by examiner

SEMICONDUCTOR DEVICE

CROSS-REFERENCE TO RELATED APPLICATION

This application is based upon and claims the benefit of priority from Japanese Patent Application No. 2019-052614, filed on Mar. 20, 2019, the entire contents of which are incorporated herein by reference.

FIELD

Embodiments described herein relate generally to a semiconductor device.

BACKGROUND

As an example of a semiconductor device for electric power, there is an insulated gate bipolar transistor (IGBT). In the IGBT, for example, a collector region of p-type, a drift region of n-type, and a base region of p-type are provided on a collector electrode. Then, a gate electrode is provided on the base region of p-type, sandwiching a gate insulating film between the gate electrode and the base region of p-type. Further, an emitter region of n-type connected to an emitter electrode is provided on the surface of the base region of p-type.

In the above-described IGBT, a positive voltage higher than a threshold voltage is applied to the gate electrode, whereby a channel is formed in the base region of p-type. Then, electrons are injected from the emitter region of n-type to the drift region of n-type, and holes are injected from the collector region of p-type to the drift region of n-type. As a result, a current having electrons and holes as carriers flows between the collector electrode and the emitter electrode.

Various attempts have been made to improve characteristics of the IGBT, such as reduction of the on-resistance, reduction of the turn-off loss, and suppression of generation of the surge voltage. For example, to reduce the turn-off loss of the IGBT, it has been proposed to provide a gate electrode also on the collector electrode's side. At the time of turn-off of the IGBT, a voltage higher than the threshold voltage may be applied to the gate electrode on the collector electrode's side, then the injection of holes from the collector electrode is suppressed, and the turn-off time is shortened, whereby the turn-off loss is reduced.

DETAILED DESCRIPTION

Figure 1:
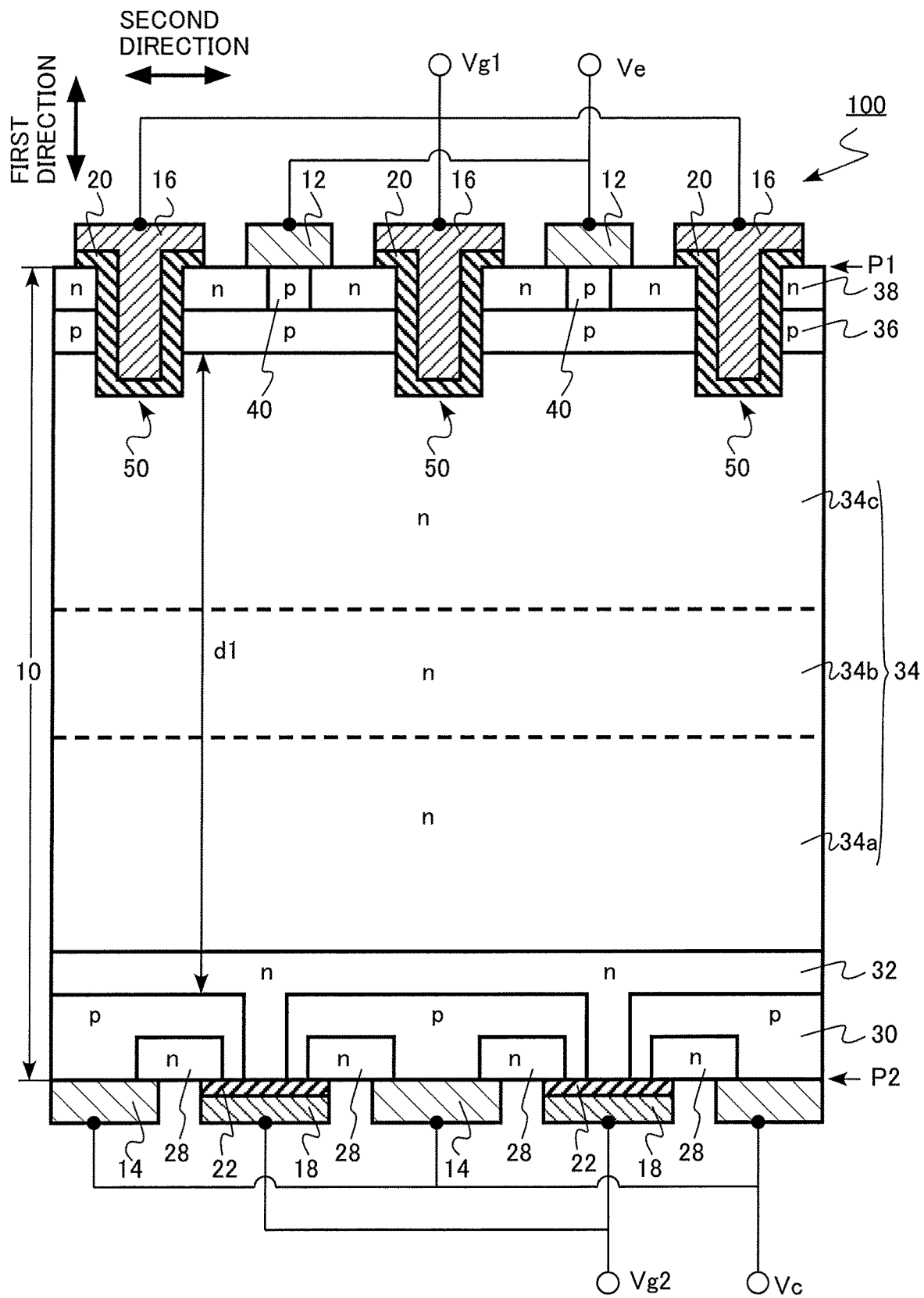
FIG. 1 is a schematic sectional view of part of a semiconductor device of a first embodiment.

Hereinafter, embodiments of the present disclosure will be described with reference to the drawings. In the following description, the same and similar members and the like are denoted by the same reference numerals, and the explanation of the members and the like once described is omitted as appropriate. In the present specification, "carrier concentration" in a semiconductor region means a difference between a majority carrier concentration and a minority carrier concentration in a thermal equilibrium state. A relative magnitude relationship between "carrier concentrations" of two semiconductor regions can be determined by using, for example, scanning capacitance microscopy (SCM). In addition, a distribution and an absolute value of "carrier concentration" can be measured by using, for example, spreading resistance analysis (SRA). In addition, a distribution and an absolute value of "impurity concentration" in a semiconductor region can be measured by using, for example, secondary ion mass spectrometry (SIMS).

First Embodiment

A semiconductor device of a first embodiment includes: a first electrode; a second electrode; a first gate electrode; a second gate electrode; and a semiconductor layer including a first plane and a second plane facing the first plane, the first electrode and the first gate electrode provided on a side of the first plane, and the second electrode and the second gate electrode provided on a side of the second plane, the semiconductor layer including a first semiconductor region of first conductivity type including a first portion, a second portion provided between the first portion and the first plane and having a carrier concentration higher than a carrier concentration of the first portion, and a third portion provided between the second portion and the first plane and having a carrier concentration lower than a carrier concentration of the second portion, a second semiconductor region of second conductivity type provided between the first semiconductor region and the first plane, a part of the second semiconductor region facing the first gate electrode, a third semiconductor region of first conductivity type provided between the second semiconductor region and the first plane, a part of the third semiconductor region facing the first gate electrode and a part of the third semiconductor region being in contact with the first electrode, a fourth semiconductor region of second conductivity type provided between the first semiconductor region and the second plane, a part of the fourth semiconductor region facing the second gate electrode and a part of the fourth semiconductor region being in contact with the second electrode, and a fifth semiconductor region of first conductivity type provided between the fourth semiconductor region and the second plane, a part of the fifth semiconductor region facing the second gate electrode and a part of the fifth semiconductor region being in contact with the second electrode.

Figure 2:
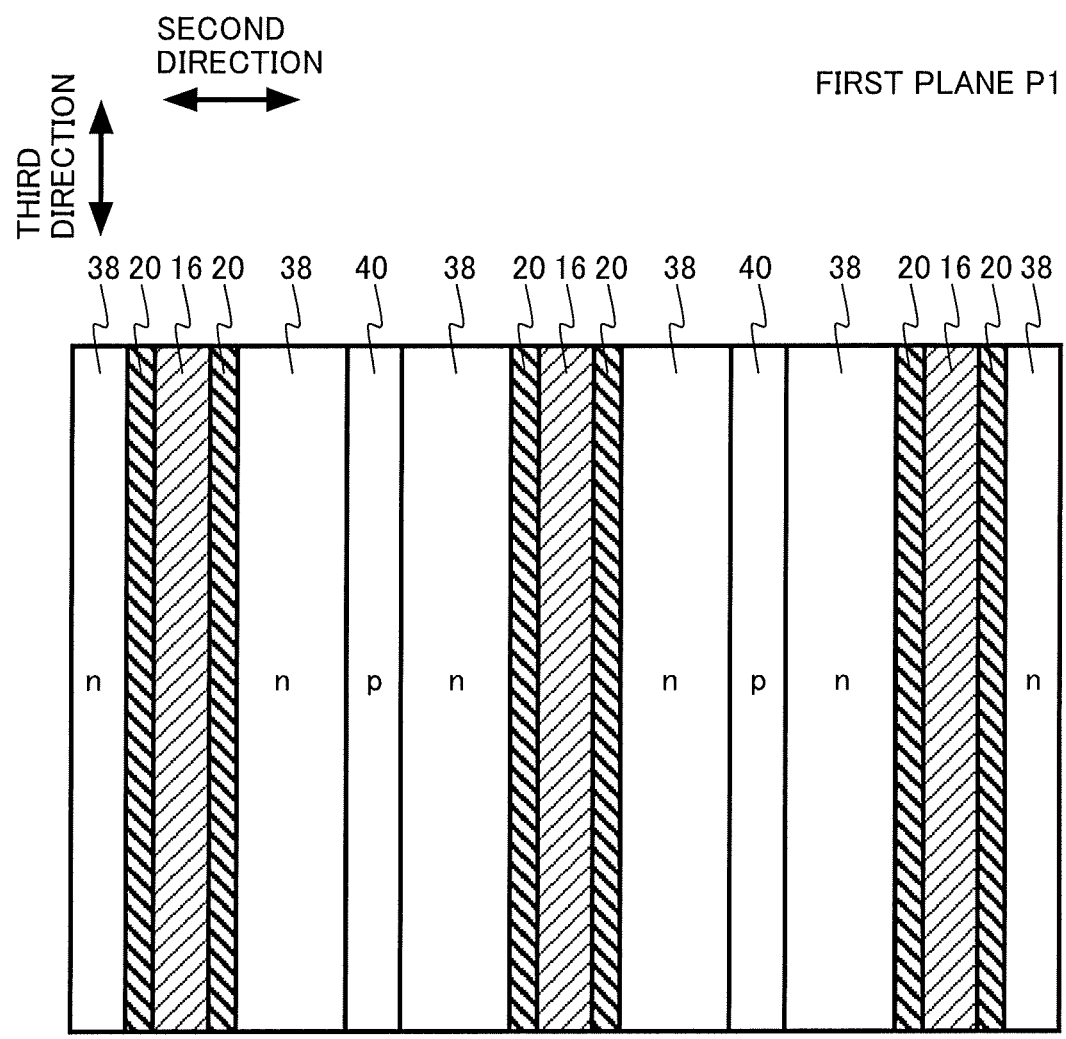
FIG. 2 is a schematic plan view of a first plane of the semiconductor device of the first embodiment.
Figure 3:
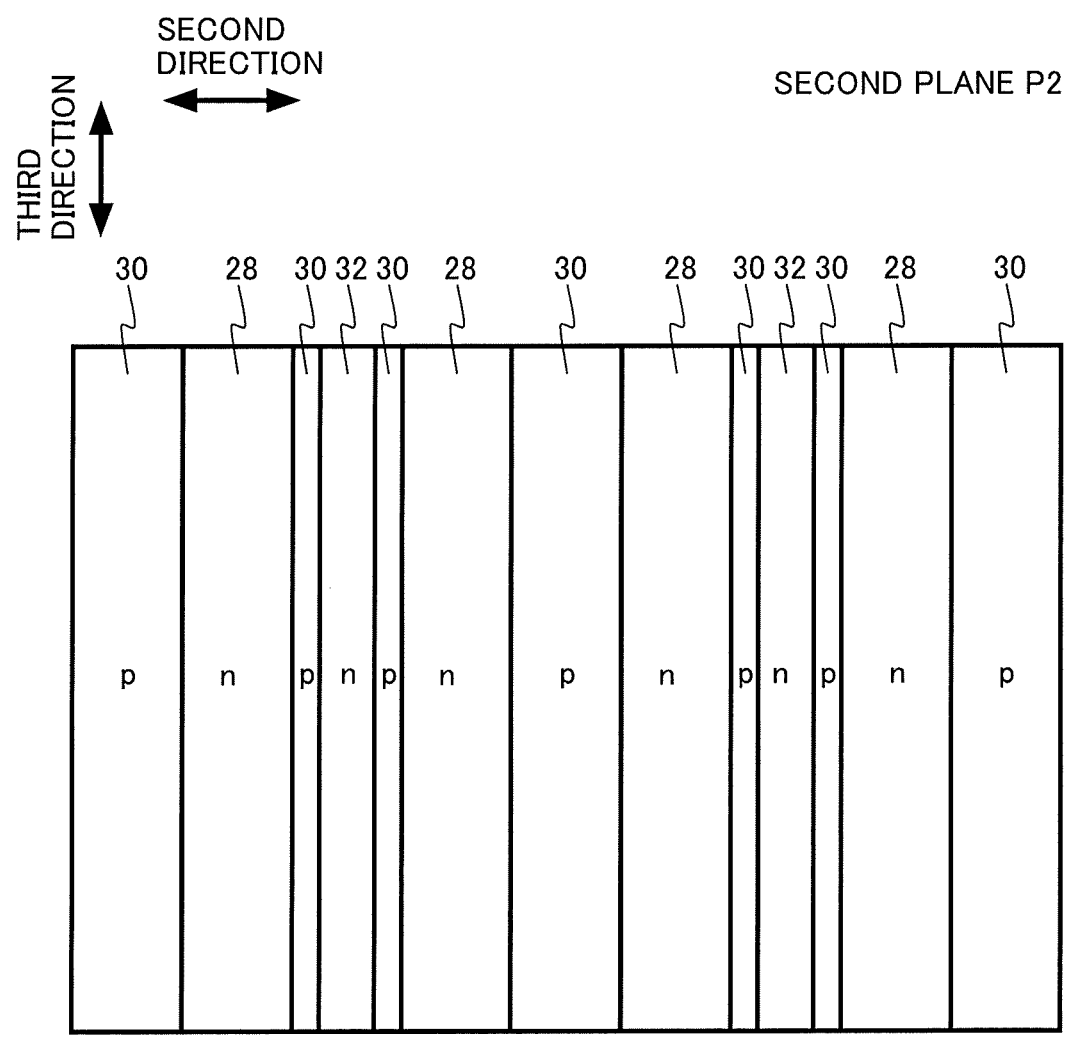
FIG. 3 is a schematic plan view of a second plane of the semiconductor device of the first embodiment.

FIG. 1 is a schematic sectional view of part of the semiconductor device of the first embodiment. FIG. 2 is a schematic plan view of the first plane of the semiconductor device of the first embodiment. FIG. 3 is a schematic plan view of the second plane of the semiconductor device of the first embodiment. Hereinafter, a case will be described as an example where the first conductivity type is n-type and the second conductivity type is p-type.

The semiconductor device of the first embodiment is an IGBT 100 of trench gate type including a main gate electrode in a trench formed in the front surface's side of the semiconductor layer. In addition, the IGBT 100 also includes a control gate electrode on the back surface of the semiconductor layer.

The IGBT 100 of the first embodiment includes a semiconductor layer 10, an emitter electrode 12, a collector electrode 14, a main gate electrode 16 (first gate electrode), a control gate electrode 18 (second gate electrode), a first gate insulating film 20, and a second gate insulating film 22. A trench 50 is formed in the semiconductor layer 10.

In the semiconductor layer 10, provided are a back surface drain region 28 (fifth semiconductor region) of n-type, a collector region 30 (fourth semiconductor region) of p-type, a buffer region 32 (sixth semiconductor region) of n-type, a drift region 34 (first semiconductor region) of n-type, a base region 36 (second semiconductor region) of p-type, an emitter region 38 (third semiconductor region) of n-type, and a contact region 40 of p-type. The drift region 34 includes a first low concentration portion 34a (first portion), a first high concentration portion 34b (second portion), and a second low concentration portion 34c (third portion).

The semiconductor layer 10 includes a first plane P1 and a second plane P2 facing the first plane P1. The first plane P1 is the front surface of the semiconductor layer 10, and the second plane P2 is the back surface of the semiconductor layer 10. The semiconductor layer 10 is, for example, single crystal silicon. The film thickness of the semiconductor layer 10 is, for example, greater than or equal to 40 µm and less than or equal to 700 µm.

A direction of the normal line of the first plane P1, and a direction of the normal line of the second plane P2 are defined as a first direction. One direction parallel to the first plane P1 and the second plane P2 is defined as a second direction. A direction parallel to the first plane P1 and the second plane P2 and perpendicular to the second direction is defined as a third direction.

The emitter electrode 12 is provided on the first plane P1's side of the semiconductor layer 10. At least a part of the emitter electrode 12 is in contact with the first plane P1 of the semiconductor layer 10. The emitter electrode 12 is, for example, a metal. An emitter voltage (Ve) is applied to the emitter electrode 12. The emitter voltage is, for example, 0 V.

The collector electrode 14 is provided on the second plane P2's side of the semiconductor layer 10. At least a part of the collector electrode 14 is in contact with the second plane P2 of the semiconductor layer 10. The collector electrode 14 is, for example, a metal.

A collector voltage (Vc) is applied to the collector electrode 14. The collector voltage is, for example, greater than or equal to 200 V and less than or equal to 6500 V.

The main gate electrode 16 is provided on the first plane P1's side of the semiconductor layer 10. At least a part of the main gate electrode 16 is provided in the trench 50 formed on the first plane P1's side of the semiconductor layer 10. The main gate electrode 16 extends in the third direction on the first plane P1 of the semiconductor layer 10.

The main gate electrode 16 is, for example, polycrystalline silicon containing n-type impurities or p-type impurities. A first gate voltage (Vg1) is applied to the main gate electrode 16.

The first gate insulating film 20 is provided between the main gate electrode 16 and the semiconductor layer 10. At least a part of the first gate insulating film 20 is provided in the trench 50. The first gate insulating film 20 is, for example, a silicon oxide film.

The control gate electrode 18 is provided on the second plane P2's side of the semiconductor layer 10. The control gate electrode 18 extends in the third direction on the second plane P2 of the semiconductor layer 10.

The control gate electrode 18 is, for example, polycrystalline silicon containing n-type impurities or p-type impurities. A second gate voltage (Vg2) is applied to the control gate electrode 18.

The second gate insulating film 22 is provided between the control gate electrode 18 and the semiconductor layer 10. The second gate insulating film 22 is, for example, a silicon oxide film.

The collector region 30 of p-type is provided in part between the drift region 34 and the second plane P2. Part of the collector region 30 is in contact with the second plane P2.

Part of the collector region 30 faces the control gate electrode 18, sandwiching the second gate insulating film 22 between the part and the control gate electrode 18. The collector region 30 extends in the third direction on the second plane P2. In the collector region 30 facing the control gate electrode 18, a channel of a back surface transistor controlled by the control gate electrode 18 is formed.

The collector region 30 is electrically connected to the collector electrode 14. Part of the collector region 30 is in contact with the collector electrode 14.

The back surface drain region 28 of n-type is provided in part between the collector region 30 and the second plane P2. Part of the back surface drain region 28 faces the control gate electrode 18, sandwiching the second gate insulating film 22 between the part and the control gate electrode 18.

Part of the back surface drain region 28 of n-type is in contact with the collector electrode 14. The back surface drain region 28 extends in the third direction on the second plane P2. The back surface drain region 28 functions as a drain of the back surface transistor.

A carrier concentration of the back surface drain region 28 is higher than a carrier concentration of the drift region 34. An n-type impurity concentration of the back surface drain region 28 is higher than an n-type impurity concentration of the drift region 34.

The drift region 34 of n-type is provided between the collector region 30 and the first plane P1. The drift region 34 is provided between the collector region 30 and the base region 36.

The drift region 34 becomes a path of an on-state current in the on state of the IGBT 100. The drift region 34 has a function of depletion in the off state of the IGBT 100, and maintaining the breakdown voltage of the IGBT 100.

The drift region 34 includes the first low concentration portion 34a (first portion), the first high concentration portion 34b (second portion), and the second low concentration portion 34c (third portion).

The first high concentration portion 34b is provided between the first low concentration portion 34a and the first plane P1. The second low concentration portion 34c is provided between the first high concentration portion 34b and the first plane P1. That is, the first high concentration portion 34b is provided between the first low concentration portion 34a and the second low concentration portion 34c.

The first high concentration portion 34b extends in a direction parallel to the first plane P1, in the drift region 34. The first high concentration portion 34b extends in the second direction and the third direction, in the drift region 34. The first high concentration portion 34b is like a layer. The first high concentration portion 34b divides the first low concentration portion 34a from the second low concentration portion 34c.

A carrier concentration of the first high concentration portion 34b is higher than a carrier concentration of the first low concentration portion 34a. In addition, the carrier concentration of the first high concentration portion 34b is higher than a carrier concentration of the second low concentration portion 34c.

An n-type impurity concentration of the first high concentration portion 34b is higher than an n-type impurity concentration of the first low concentration portion 34a. In addition, the n-type impurity concentration of the first high concentration portion 34b is higher than an n-type impurity concentration of the second low concentration portion 34c.

The first high concentration portion 34b can be formed, for example, by ion implantation of phosphorus (P) or protons. In addition, the first high concentration portion 34b can be formed, for example, by increasing a concentration of n-type impurities such as phosphorus (P) to be introduced when the drift region 34 is formed by epitaxial growth.

The buffer region 32 of n-type is provided between the drift region 34 and the collector region 30. Part of the buffer region 32 is in contact with the second plane P2. Part of the buffer region 32 faces the control gate electrode 18, sandwiching the second gate insulating film 22 between the part and the control gate electrode 18.

A carrier concentration of the buffer region 32 is higher than the carrier concentration of the drift region 34. An n-type impurity concentration of the buffer region 32 is higher than an n-type impurity concentration of the drift region 34.

The buffer region 32 has a lower resistance than that of the drift region 34. The buffer region 32 is provided, whereby discharge is promoted of electrons from the drift region 34 to the collector electrode 14 via the back surface transistor when the back surface transistor is turned on. In addition, the buffer region 32 also has a function of suppressing extension of a depletion layer in the off state of the IGBT 100. Note that, a configuration can also be made in which the buffer region 32 is not provided.

Figure 4:
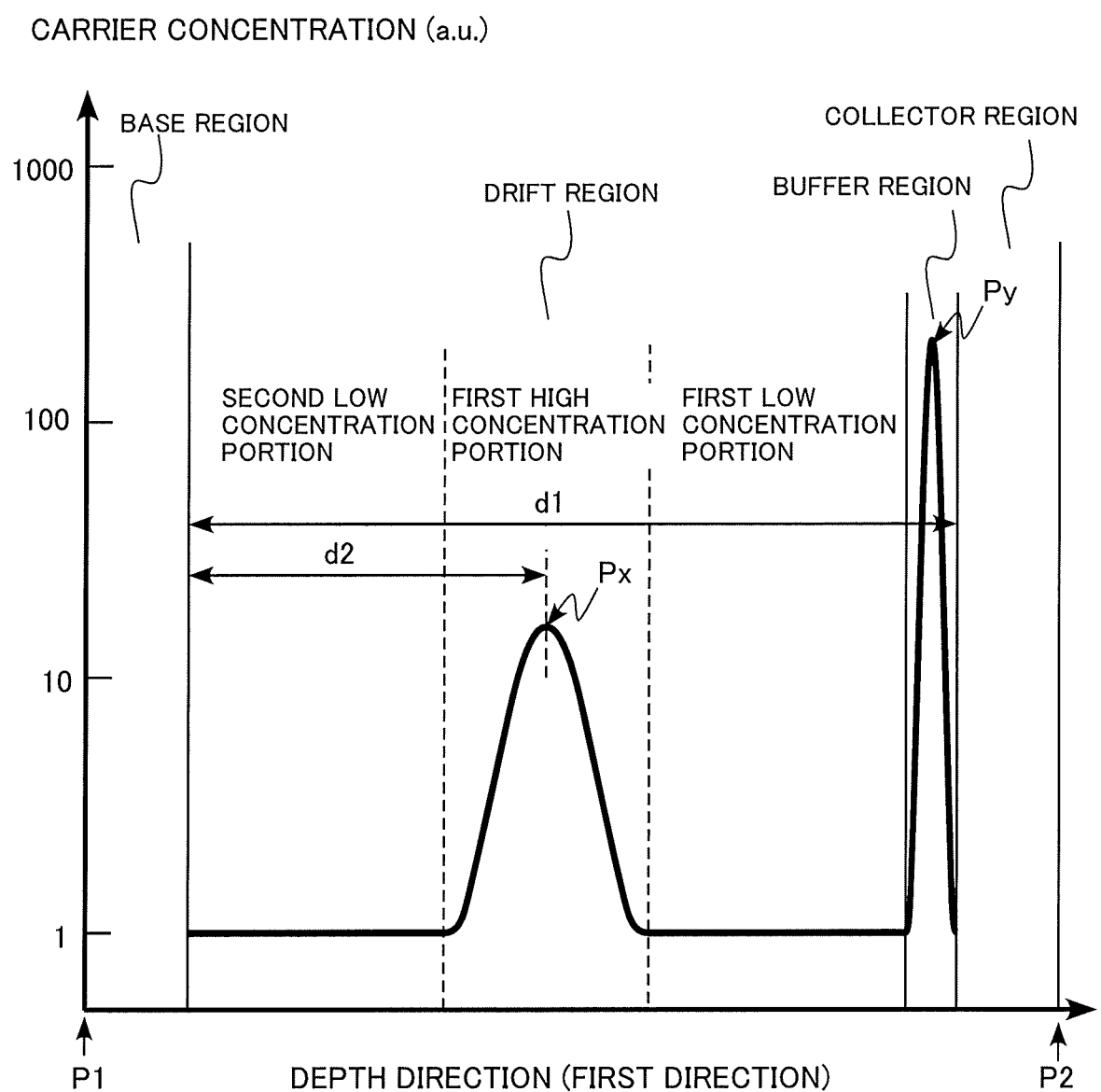
FIG. 4 is a view illustrating a carrier concentration distribution of the first embodiment.

FIG. 4 is a view illustrating a carrier concentration distribution of the first embodiment. FIG. 4 illustrates the carrier concentration distribution in the depth direction (first direction) of the drift region 34 and the buffer region 32.

A distance in the first direction from the base region 36 to the collector region 30 is defined as a first distance (d1 in FIGS. 1 and 4). In addition, a distance in the first direction from the base region 36 to a first peak (Px in FIG. 4) of the carrier concentration distribution of the first high concentration portion 34b is defined as a second distance (d2 in FIG. 4). In this case, the second distance d2 is, for example, larger than one quarter of the first distance d1, and the second distance d2 is smaller than three quarters of the first distance d1. In addition, the second distance d2 is, for example, smaller than one half of the first distance d1. Note that, a peak of the carrier concentration distribution is a position at which the carrier concentration distribution indicates the maximum value.

The second distance d2 is larger than a distance in the first direction from the base region 36 to the bottom of the trench 50. In other words, the depth from the first plane P1 to the first peak Px of the first high concentration portion 34b is deeper than the depth of the trench 50 from the first plane P1.

A carrier concentration of the first peak Px of the first high concentration portion 34b is, for example, greater than or equal to 10 times the carrier concentration of the first low concentration portion 34a. The carrier concentration of the first peak Px of the first high concentration portion 34b is, for example, greater than or equal to 10 times the carrier concentration of the second low concentration portion 34c.

The carrier concentration of the first low concentration portion 34a and the carrier concentration of the second low concentration portion 34c are, for example, greater than or equal to $1\times10^{13}$ cm$^{-3}$ and less than or equal to $1\times10^{14}$ cm$^{-3}$. The carrier concentration of the first peak Px of the first high concentration portion 34b is, for example, greater than or equal to $1\times10^{14}$ cm$^{-3}$ and less than or equal to $1\times10^{15}$ cm$^{-3}$.

A full width at half maximum of the carrier concentration distribution of the first high concentration portion 34b is, for example, greater than or equal to 5 μm and less than or equal to 20 μm.

The maximum n-type impurity concentration of a distribution of the n-type impurity concentration of the first high concentration portion 34b is, for example, greater than or equal to 10 times the n-type impurity concentration of the first low concentration portion 34a. The maximum n-type impurity concentration of the first high concentration portion 34b is, for example, greater than or equal to 10 times the n-type impurity concentration of the second low concentration portion 34c.

The first low concentration portion 34a, the first high concentration portion 34b, and the second low concentration portion 34c contain, for example, phosphorus (P) as an n-type impurity. The first high concentration portion 34b contains, for example, hydrogen (H) as an n-type impurity. Hydrogen (H) is introduced into the semiconductor layer 10, for example, by ion implantation of protons into the semiconductor layer 10.

When the n-type impurity contained in the first low concentration portion 34a, the first high concentration portion 34b, and the second low concentration portion 34c is phosphorus (P), the n-type impurity concentration of the first low concentration portion 34a and the n-type impurity concentration of the second low concentration portion 34c are, for example, greater than or equal to $1\times10^{13}$ cm$^{-3}$ and less than or equal to $1\times10^{14}$ cm$^{-3}$. In addition, the maximum value of the n-type impurity concentration of the first high concentration portion 34b is, for example, greater than or equal to $1\times10^{14}$ cm$^{-3}$ and less than or equal to $1\times10^{16}$ cm$^{-3}$.

When the n-type impurity contained in the first high concentration portion 34b is hydrogen (H) having a low activation rate, the n-type impurity concentration of the first high concentration portion 34b is, for example, greater than or equal to $1\times10^{16}$ cm$^{-3}$ and less than or equal to $1\times10^{17}$ cm$^{-3}$.

A carrier concentration of a second peak (Py in FIG. 4) of the carrier concentration distribution of the buffer region 32 is, for example, greater than or equal to 10 times the carrier concentration of the first peak Px of the carrier concentration distribution of the first high concentration portion 34b.

The carrier concentration of the second peak Py of the carrier concentration distribution of the buffer region 32 is, for example, greater than or equal to $1\times10^{16}$ cm$^{-3}$ and less than or equal to $1\times10^{17}$ cm$^{-3}$.

The full width at half maximum of the carrier concentration distribution of the first high concentration portion 34b is, for example, larger than a full width at half maximum of the carrier concentration distribution of the buffer region 32. The full width at half maximum of the carrier concentration distribution of the first high concentration portion 34b is, for example, greater than or equal to five times the full width at half maximum of the carrier concentration distribution of the buffer region 32.

The buffer region 32 contains, for example, phosphorus (P) as an n-type impurity. The maximum value of the n-type impurity concentration of the buffer region 32 is, for example, greater than or equal to $1\times10^{16}$ cm$^{-3}$ and less than or equal to $1\times10^{17}$ cm$^{-3}$.

The base region 36 of p-type is provided between the drift region 34 and the first plane P1. Part of the base region 36 faces the main gate electrode 16, sandwiching the first gate insulating film 20 between the part and the main gate electrode 16. A channel of a main transistor controlled by the main gate electrode 16 is formed in the base region 36 facing the main gate electrode 16.

The emitter region 38 of n-type is provided between the base region 36 and the first plane P1. Part of the emitter region 38 faces the main gate electrode 16, sandwiching the first gate insulating film 20 between the part and the main gate electrode 16. The emitter region 38 extends in the third direction on the first plane P1.

The emitter region 38 is electrically connected to the emitter electrode 12. Part of the emitter region 38 is in contact with the emitter electrode 12.

A carrier concentration of the emitter region 38 is higher than the carrier concentration of the drift region 34. An n-type impurity concentration of the emitter region 38 is higher than the n-type impurity concentration of the drift region 34. The emitter region 38 becomes a supply source of electrons in the on state of the IGBT 100.

The contact region 40 of p-type is provided between the base region 36 and the first plane P1. The contact region 40 extends in the third direction on the first plane P1.

The contact region 40 is electrically connected to the emitter electrode 12. The contact region 40 is in contact with the emitter electrode 12.

A carrier concentration of the contact region 40 is higher than a carrier concentration of the base region 36. A p-type impurity concentration of the contact region 40 is higher than a p-type impurity concentration of the base region 36.

Next, operation will be described of the IGBT 100.

In the off state of the IGBT 100, the emitter voltage (Ve) is applied to the emitter electrode 12. The emitter voltage is, for example, 0 V. The collector voltage (Vc) is applied to the collector electrode 14. The collector voltage is, for example, greater than or equal to 200 V and less than or equal to 6500 V.

When the IGBT 100 is caused to perform turn-on operation to be turned on, a turn-on voltage is applied to the main gate electrode 16 as the first gate voltage (Vg1). The turn-on voltage is a positive voltage exceeding the threshold voltage of the main transistor including the main gate electrode 16 as a gate electrode. The turn-on voltage is, for example, 15 V.

The turn-on voltage is applied to the main gate electrode 16, whereby an n-type inversion layer is formed in the vicinity of an interface with the first gate insulating film 20 of the base region 36 of p-type, and electrons are injected from the emitter region 38 of n-type through the n-type inversion layer into the drift region 34 of n-type. The electrons injected into the drift region 34 of n-type provide forward bias to a pn junction formed by the buffer region 32 of n-type and the collector region 30 of p-type. The electrons reach the collector electrode 14 and cause injection of holes from the collector region 30 of p-type. The IGBT 100 is turned on.

When the IGBT 100 is in the on state, the collector voltage (Vc) is applied to the control gate electrode 18 as the second gate voltage (Vg2). The back surface transistor including the control gate electrode 18 as a gate electrode is turned off.

Next, when the IGBT 100 is caused to perform turn-off operation to be turned off, a turn-off voltage is applied to the main gate electrode 16 as the first gate voltage (Vg1). Here, the turn-off voltage is a voltage lower than or equal to the threshold voltage, at which the main transistor is not turned on, and is, for example, 0 V.

The turn-off voltage is applied to the main gate electrode 16, whereby the n-type inversion layer formed in the vicinity of the interface with the first gate insulating film 20 of the base region 36 of p-type disappears, and injection is stopped of the electrons from the emitter region 38 of n-type into the drift region 34 of n-type. The IGBT 100 shifts to the off state.

The second gate voltage (Vg2) is applied to the control gate electrode 18 simultaneously with, or with a time difference to, application of the turn-off voltage to the main gate electrode 16, and the back surface transistor is turned on. In other words, to the control gate electrode 18, a positive voltage is applied higher than or equal to the threshold voltage, at which an n-type inversion layer is formed in the vicinity of an interface with the second gate insulating film 22 of the collector region 30 of p-type. To the control gate electrode 18, a voltage is applied higher than the collector voltage (Vc) applied to the collector electrode 14. In case when a power-supply voltage is 600 V, for example, collector voltage (Vc) may increase up to 600 V from a voltage around 0V, after application of the turn-off voltage to the main gate electrode 16. A voltage higher than the collector voltage (Vc)+ the threshold voltage will be applied to the control gate electrode 18 following the increase of the collector voltage (Vc). The voltage applied to the control gate electrode 18 may be increased from a voltage higher than 0V+ the threshold voltage to a voltage higher than 600V+ the threshold voltage following the increase of the collector voltage (Vc).

The n-type inversion layer is formed in the vicinity of the interface with the second gate insulating film 22 of the collector region 30 of p-type, whereby a path is formed through which electrons are discharged from the buffer region 32 of n-type through the n-type inversion layer and the back surface drain region 28 of n-type to the collector electrode 14. That is, a state occurs where the buffer region 32 of n-type and the collector electrode 14 short-circuit, so-called anode short circuit.

The anode short circuit occurs, whereby the electrons are prevented from reaching the collector electrode 14 through the collector region 30 of p-type from the buffer region 32 of n-type, and injection is suppressed of holes from the collector region 30 of p-type into the drift region 34. The injection of the holes is suppressed at the turn-off operation of the IGBT 100, whereby a tail current can be reduced at the turn-off operation. Thus, the turn-off time of the IGBT 100 is shortened. Therefore, the turn-off loss of the IGBT 100 is reduced.

Next, the function and effect will be described of the semiconductor device of the first embodiment.

As described above, in the IGBT 100 of the first embodiment, the back surface transistor is provided, whereby the injection is suppressed of the holes into the drift region 34 of n-type at the turn-off operation. The injection of the holes is suppressed, whereby the turn-off loss is reduced.

However, if the injection of the holes is completely cut off, the depletion of the drift region 34 of n-type may rapidly progress from the second plane P2's side transiently. In this case, punch-through occurs between a depletion layer extending from the first plane P1's side and a depletion layer extending from the second plane P2's side, which may generate a large surge voltage.

In the IGBT 100 of the first embodiment, the first high concentration portion 34b having a high carrier concentration is provided in the drift region 34. The first high concentration portion 34b suppresses extension of the depletion layer extending from the first plane P1's side and extension of the depletion layer extending from the second plane P2's side. Thus, the punch-through is suppressed between the depletion layer extending from the first plane P1's side and the depletion layer extending from the second plane P2's side. Therefore, generation of a high surge voltage is suppressed.

The second distance d2 from the base region 36 to the first peak Px of the carrier concentration distribution of the first high concentration portion 34b is preferably larger than one quarter of the first distance d1 between the base region 36 and the collector region 30 and smaller than three quarters of the first distance d1. The first peak Px is in the vicinity of the center of the drift region 34, whereby the extension of the depletion layer extending from above and below can be effectively suppressed.

In addition, from a viewpoint of further reducing the turn-off loss, the second distance d2 is more preferably smaller than one half of the first distance d1. To reduce the turn-off loss, it is preferable to apply a voltage at which the back surface transistor is turned on before applying the turn-off voltage to the main gate electrode 16. In this case, the depletion from the second plane P2's side becomes faster than the depletion from the first plane P1's side. A position of the first peak Px of the first high concentration portion 34b is provided at a side closer to the base region 36, that is, a side farther from the second plane P2, whereby the punch-through can be suppressed between the depletion layers even when the depletion from the second plane P2's side progresses faster.

The carrier concentration of the first peak Px of the first high concentration portion 34b is preferably greater than or equal to 10 times the carrier concentrations of the first low concentration portion 34a and the second low concentration portion 34c, from a viewpoint of effectively suppressing the extension of the depletion layer.

The carrier concentration of the first peak Px of the first high concentration portion 34b is preferably greater than or equal to $1\times10^{14}$ cm$^{-3}$ and less than or equal to $1\times10^{15}$ cm$^{-3}$. The carrier concentration higher than the above-described lower limit value can effectively suppress the extension of the depletion layer. The carrier concentration lower than the above-described upper limit can suppress a decrease in breakdown voltage of the IGBT100.

The full width at half maximum of the carrier concentration distribution of the first high concentration portion 34b is preferably greater than or equal to 5 µm and less than or equal to 20 µm. The full width at half maximum higher than the above-described lower limit value can effectively suppress the extension of the depletion layer. The full width at half maximum lower than the above-described upper limit can suppress a decrease in breakdown voltage of the IGBT100.

The full width at half maximum of the carrier concentration distribution of the first high concentration portion 34b is preferably larger than the full width at half maximum of the carrier concentration distribution of the buffer region 32, from the viewpoint of effectively suppressing the extension of the depletion layer. The full width at half maximum of the carrier concentration distribution of the first high concentration portion 34b is more preferably greater than or equal to five times the full width at half maximum of the carrier concentration distribution of the buffer region 32, from the viewpoint of effectively suppressing the extension of the depletion layer.

The carrier concentration of the second peak Py of the carrier concentration distribution of the buffer region 32 is preferably greater than or equal to 10 times, more preferably greater than or equal to 50 times, further preferably greater than or equal to 100 times the carrier concentration of the first peak Px of the carrier concentration distribution of the first high concentration portion 34b. A resistance of the buffer region 32 is reduced, and the discharge is promoted of electrons from the drift region 34 to the collector electrode 14 via the back surface transistor.

The carrier concentration of the second peak Py of the carrier concentration distribution of the buffer region 32 is preferably greater than or equal to $1\times10^{16}$ cm$^{-3}$ and $1\times10^{17}$ cm$^{-3}$. When the carrier concentration is set to greater than or equal to $1\times10^{16}$ cm$^{-3}$, the resistance of the buffer region 32 is reduced, and the discharge is promoted of electrons from the drift region 34 to the collector electrode 14 via the back surface transistor.

As described above, according to the IGBT of the first embodiment, it becomes possible to achieve both reduction of the turn-off loss and suppression of generation of the surge voltage of the IGBT.

Second Embodiment

A semiconductor device of a second embodiment is different from the semiconductor device of the first embodiment in that the first semiconductor region includes: a fourth portion provided between the first portion and the second plane and having a carrier concentration higher than the carrier concentration of the first portion; and a fifth portion provided between the fourth portion and the second plane and having a carrier concentration lower than the carrier concentration of the fourth portion. Hereinafter, description overlapping with the first embodiment will be omitted.

Figure 5:
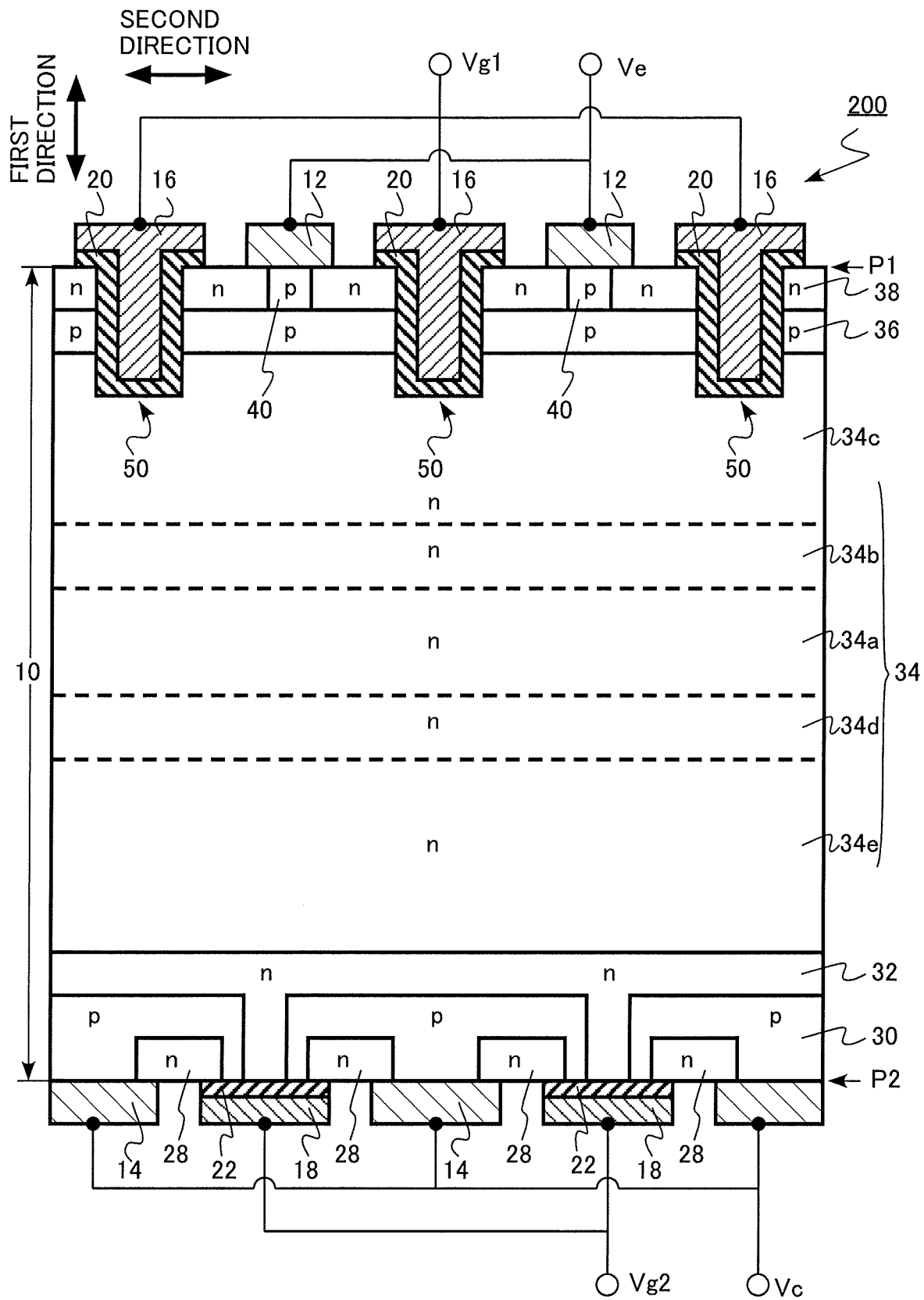
FIG. 5 is a schematic sectional view of part of a semiconductor device of a second embodiment.

FIG. 5 is a schematic sectional view of part of the semiconductor device of the second embodiment. Hereinafter, a case will be described as an example where the first conductivity type is n-type and the second conductivity type is p-type.

The semiconductor device of the second embodiment is an IGBT 200 of trench gate type including a main gate electrode in a trench formed in the front surface's side of the semiconductor layer. In addition, the IGBT 200 also includes a control gate electrode on the back surface of the semiconductor layer.

The IGBT 200 of the second embodiment includes a semiconductor layer 10, an emitter electrode 12, a collector electrode 14, a main gate electrode 16 (first gate electrode), a control gate electrode 18 (second gate electrode), a first gate insulating film 20, and a second gate insulating film 22. A trench 50 is formed in the semiconductor layer 10.

In the semiconductor layer 10, provided are a back surface drain region 28 (fifth semiconductor region) of n-type, a collector region 30 (fourth semiconductor region) of p-type, a buffer region 32 (sixth semiconductor region) of n-type, a drift region 34 (first semiconductor region) of n-type, a base region 36 (second semiconductor region) of p-type, an emitter region 38 (third semiconductor region) of n-type, and a contact region 40 of p-type. The drift region 34 includes a first low concentration portion 34a (first portion), a first high concentration portion 34b (second portion), a second low concentration portion 34c (third portion), a second high concentration portion 34d (fourth portion), and a third low concentration portion 34e (fifth portion).

The first high concentration portion 34b is provided between the first low concentration portion 34a and a first plane P1. The second low concentration portion 34c is provided between the first high concentration portion 34b and the first plane P1. The first high concentration portion 34b is provided between the first low concentration portion 34a and the second low concentration portion 34c.

The second high concentration portion 34d is provided between the first low concentration portion 34a and a second plane P2. The third low concentration portion 34e is provided between the second high concentration portion 34d and the second plane P2. The second high concentration portion 34d is provided between the first low concentration portion 34a and the third low concentration portion 34e.

The IGBT 200 of the second embodiment is provided with the first high concentration portion 34b and the second high concentration portion 34d each having a high carrier concentration in the drift region 34. As in the first embodiment, the first high concentration portion 34b and the second high concentration portion 34d suppress extension of the depletion layer extending from the first plane P1's side and extension of the depletion layer extending from the second plane P2's side. Thus, the punch-through is suppressed between the depletion layer extending from the first plane P1's side and the depletion layer extending from the second plane P2's side. Therefore, generation of a surge voltage is suppressed.

Further, a plurality of regions each having a high carrier concentration is provided in the drift region 34, whereby the design freedom is increased of the carrier concentration distribution in the drift region 34. Thus, it becomes easy to achieve both suppression of the surge voltage and securing the breakdown voltage of the IGBT 200. In addition, manufacturing is easier in forming a plurality of thin regions than in forming one thick region having a high carrier concentration.

As described above, according to the IGBT of the second embodiment, as in the first embodiment, it becomes possible to achieve both reduction of the turn-off loss and suppression of generation of the surge voltage of the IGBT. Further, it becomes easy to achieve both suppression of the surge voltage and securing the breakdown voltage of the IGBT.

Third Embodiment

A semiconductor circuit of a third embodiment includes the semiconductor device of the first embodiment and a control circuit controlling the semiconductor device. Hereinafter, description overlapping with the first embodiment will be omitted.

Figure 6:
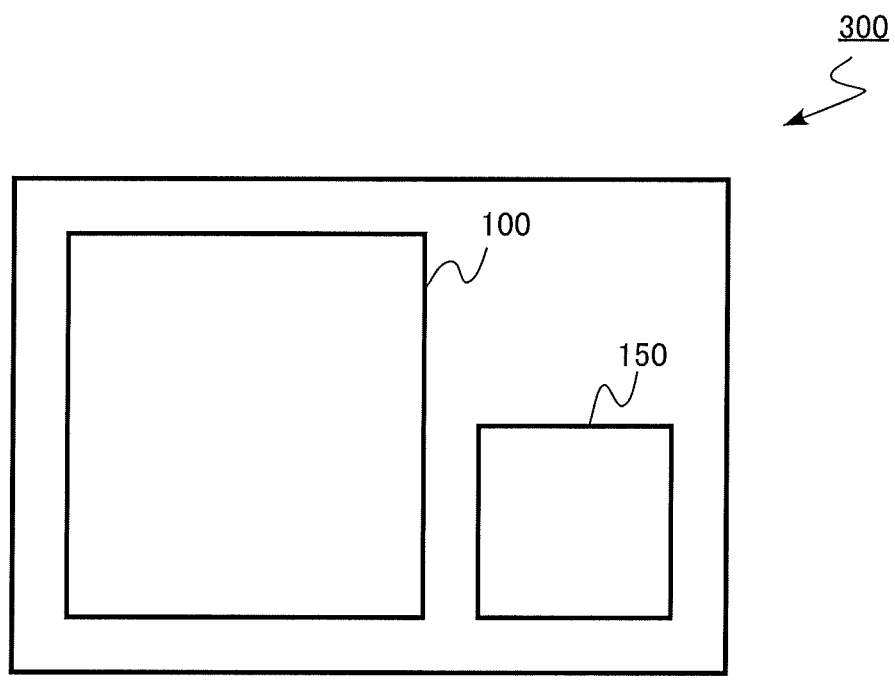
FIG. 6 is a schematic view a semiconductor circuit of a third embodiment.

FIG. 6 is a schematic view a semiconductor circuit of a third embodiment. The semiconductor circuit 300 may be semiconductor module. The semiconductor circuit 300 includes IGBT 100 and control circuit 150. The control circuit 150 configured to control an operation of the IGBT 100. IGBT 100 is the example of the semiconductor device of the first embodiment.

In the first and second embodiments, the case has been described as an example where the semiconductor layer is single crystal silicon; however, the semiconductor layer is not limited to single crystal silicon. For example, other single crystal semiconductors may be used, such as single crystal silicon carbide.

In the first and second embodiments, the case has been described as an example where the main transistor is a transistor of trench gate type; however, the main transistor may be a transistor of planar gate type. In addition, the case has been described as an example where the back surface transistor is a transistor of planar gate type; however, the back surface transistor may be a transistor of trench gate type.

In the first and second embodiments, the case has been described as an example where the first conductivity type is n-type and the second conductivity type is p-type; however, the first conductivity type can be p-type and the second conductivity type can be n-type.

In the second embodiment, the case has been described as an example where the number of high concentration portions in the drift region 34 is two; however, the number of high concentration portions may be three or more.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a second electrode;
a first gate electrode;
a second gate electrode; and
a semiconductor layer including a first plane and a second plane facing the first plane, the first electrode and the first gate electrode provided on a side of the first plane, and the second electrode and the second gate electrode provided on a side of the second plane,
the semiconductor layer including
a first semiconductor region of first conductivity type including a first portion, a second portion provided between the first portion and the first plane and having a carrier concentration higher than a carrier concentration of the first portion, and a third portion provided between the second portion and the first plane and having a carrier concentration lower than a carrier concentration of the second portion,
a second semiconductor region of second conductivity type provided between the first semiconductor region and the first plane, a part of the second semiconductor region facing the first gate electrode,
a third semiconductor region of first conductivity type provided between the second semiconductor region and the first plane, a part of the third semiconductor region facing the first gate electrode and a part of the third semiconductor region being in contact with the first electrode,
a fourth semiconductor region of second conductivity type provided between the first semiconductor region and the second plane, a part of the fourth semiconductor region facing the second gate electrode and a part of the fourth semiconductor region being in contact with the second electrode, and
a fifth semiconductor region of first conductivity type provided between the fourth semiconductor region and the second plane, a part of the fifth semiconductor region facing the second gate electrode and a part of the fifth semiconductor region being in contact with the second electrode, wherein, when a direction of a normal line of the first plane is defined as a first direction, and a distance in the first direction from the second semiconductor region to the fourth semiconductor region is defined as a first distance, and a distance in the first direction from the second semiconductor region to a first peak of a carrier concentration distribution of the second portion is defined as a second distance, the second distance is larger than one quarter of the first distance, and the second distance is smaller than three quarter of the first distance.

2. The semiconductor device according to claim 1, wherein a carrier concentration of the first peak is greater than or equal to 10 times the carrier concentration of the first portion and the carrier concentration of the third portion.

3. The semiconductor device according to claim 1, wherein a carrier concentration of the first peak is greater than or equal to $1\times10^{14}$ cm$^{-3}$ and less than or equal to $1\times10^{15}$ cm$^{-3}$.

4. The semiconductor device according to claim 1, wherein a full width at half maximum of a carrier concentration distribution of the second portion is greater than or equal to 5 μm and less than or equal to 20 μm.

5. The semiconductor device according to claim 1, wherein the first semiconductor region includes: a fourth portion provided between the first portion and the second plane and having a carrier concentration higher than the carrier concentration of the first portion; and a fifth portion provided between the fourth portion and the second plane and having a carrier concentration lower than the carrier concentration of the fourth portion.

6. The semiconductor device according to claim 1, wherein the semiconductor layer includes a sixth semiconductor region of first conductivity type provided between the first semiconductor region and the fourth semiconductor region and having a carrier concentration higher than a carrier concentration of the first semiconductor region.

7. The semiconductor device according to claim 6, wherein a carrier concentration of a second peak of a carrier concentration distribution of the sixth semiconductor region is greater than or equal to 10 times a carrier concentration of a first peak of a carrier concentration distribution of the second portion.

8. The semiconductor device according to claim 6, wherein a full width at half maximum of a carrier concentration distribution of the second portion is larger than a full width at half maximum of a carrier concentration distribution of the sixth semiconductor region.

9. The semiconductor device according to claim 1, wherein the second distance is smaller than one half of the first distance.

10. A semiconductor device comprising:
a first electrode;
a second electrode;
a first gate electrode;
a second gate electrode; and
a semiconductor layer including a first plane and a second plane facing the first plane, the first electrode and the first gate electrode provided on a side of the first plane, and the second electrode and the second gate electrode provided on a side of the second plane,
the semiconductor layer including
a first semiconductor region of first conductivity type including a first portion, a second portion provided between the first portion and the first plane and having a carrier concentration higher than a carrier concentration of the first portion, and a third portion provided between the second portion and the first plane and having a carrier concentration lower than a carrier concentration of the second portion,
a second semiconductor region of second conductivity type provided between the first semiconductor region and the first plane, a part of the second semiconductor region facing the first gate electrode,
a third semiconductor region of first conductivity type provided between the second semiconductor region and the first plane, a part of the third semiconductor region facing the first gate electrode and a part of the third semiconductor region being in contact with the first electrode,
a fourth semiconductor region of second conductivity type provided between the first semiconductor region and the second plane, a part of the fourth semiconductor region facing the second gate electrode and a part of the fourth semiconductor region being in contact with the second electrode, and
a fifth semiconductor region of first conductivity type provided between the fourth semiconductor region and the second plane, a part of the fifth semiconductor region facing the second gate electrode and a part of the fifth semiconductor region being in contact with the second electrode,
wherein a full width at half maximum of a carrier concentration distribution of the second portion is greater than or equal to 5 μm and less than or equal to 20 μm.

* * * * *